United States Patent
Maes et al.

(10) Patent No.: US 7,863,943 B2
(45) Date of Patent: Jan. 4, 2011

(54) SAMPLING DEVICE AND CIRCUIT HAVING A SINGLE VOLTAGE SUPPLY

(75) Inventors: David Maes, Cupertino, CA (US); Bharath Mandyam, Madison, WI (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 3 days.

(21) Appl. No.: 12/240,829

(22) Filed: Sep. 29, 2008

(65) Prior Publication Data

US 2009/0085648 A1    Apr. 2, 2009

Related U.S. Application Data

(60) Provisional application No. 60/976,332, filed on Sep. 28, 2007.

(51) Int. Cl.
*H03K 17/00* (2006.01)
(52) U.S. Cl. .................. 327/91; 327/95; 327/390; 327/589
(58) Field of Classification Search .............. 327/91, 327/95, 390, 589
See application file for complete search history.

(56) References Cited

U.S. PATENT DOCUMENTS

| | | | | |
|---|---|---|---|---|
| 4,734,599 A | * | 3/1988 | Bohac, Jr. ................. | 327/356 |
| 5,945,872 A | * | 8/1999 | Robertson et al. ........... | 327/541 |
| 6,255,865 B1 | * | 7/2001 | Opris ........................ | 327/94 |
| 6,310,565 B1 | * | 10/2001 | Ong et al. .................. | 341/122 |
| 7,253,675 B2 | * | 8/2007 | Aksin et al. ................ | 327/390 |
| 2002/0089366 A1 | | 7/2002 | Gupta | |
| 2006/0202742 A1 | | 9/2006 | Aksin | |

* cited by examiner

*Primary Examiner*—Kenneth B. Wells
(74) *Attorney, Agent, or Firm*—North Weber & Baugh LLP

(57) ABSTRACT

In embodiments of the present invention a device, circuit, and method are described for sampling input signal voltages, which may include voltages below a negative supply voltage for the device or circuit, without requiring static current from the input. Various embodiments of the invention obviate the requirement of an external negative supply voltage or attenuation resistors to allow sampling between a positive and negative voltage range. These embodiments result in a lower power sampling solution as well as simplifying any driver circuitry required by the sampler. The embodiments of the invention may be applied to sampling processes within analog-to-digital converters and may also be applicable to various other types of circuits in which a sampling input having input voltages that are lower than its negative supply voltage.

16 Claims, 4 Drawing Sheets

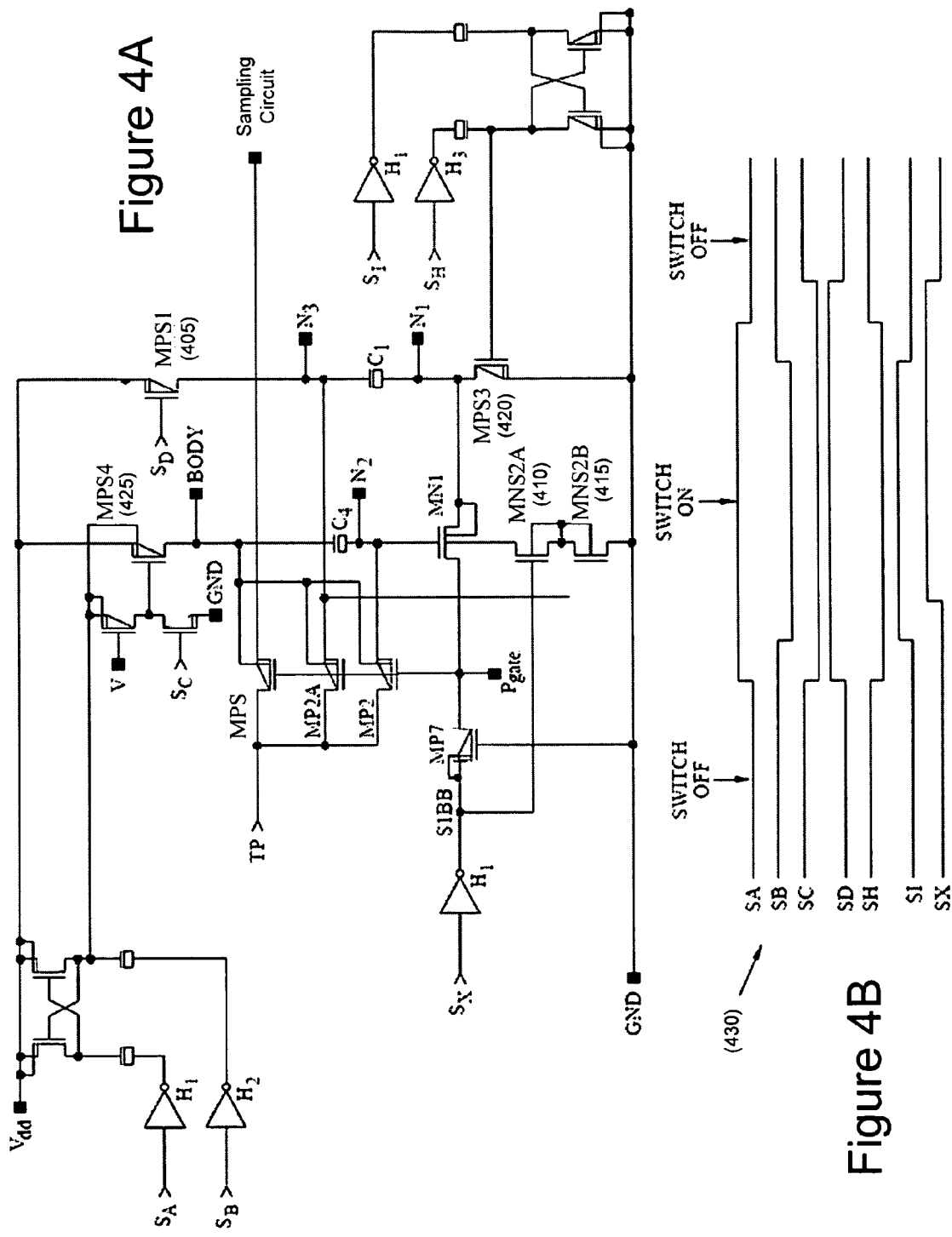

SAMPLING DEVICE AND CIRCUIT HAVING A SINGLE VOLTAGE SUPPLY

CROSS REFERENCE TO RELATED PATENT APPLICATIONS

This application claims priority to U.S. Provisional Application Ser. No. 60/976,332, entitled "Sampling Circuit," filed Sep. 28, 2007, which application is incorporated herein by reference in its entirety

BACKGROUND

1. Field of the Invention

The present invention relates generally to integrated sampling circuits, and more particularly to single-supply sampling circuits that sample between a positive and negative voltage range.

2. Background of the Invention

The importance of electronic circuitry and the continual reduction of chip geometries in which these circuits are realized is well understood. In designing various electrical circuits, the substrate or wafer area requirements of the circuits are oftentimes very important because of size constraints in which the chip may be located as well as the cost of manufacturing the chip.

As processes and devices move towards smaller geometries to save space and reduce cost, supply and input voltages levels have to be reduced. However, most real world applications continue to have higher voltage transducer signals. Conventional methodologies to sample these types of real world signals generally require supply voltages that are beyond the input signal voltage range. Oftentimes, the supply voltage requirements of the semiconductor process and the real word signals are in conflict, resulting in many existing designs requiring multiple supply voltages. In particular where signal swings are symmetric around a ground potential, existing integrated circuit designs for the most part require both positive and negative supply voltages. The inclusion of these supply voltages has undesirable system cost and complexity implications.

An alternative to multiple supply voltages is to attenuate real world signals to the voltage levels supported by modern semiconductor processes. The use of voltage attenuators, however, has several disadvantages including requiring higher transducer current to drive the attenuator and more importantly increased system noise.

Therefore, what is needed is a device and method that addresses the above-described disadvantages of the prior art including the use of multiple power supplies and input attenuation resistors.

SUMMARY OF THE INVENTION

In embodiments of the present invention a device, circuit, and method are described for sampling input signal voltages, which may include voltages below a negative supply voltage of the device or circuit, without requiring static current from the input. Various embodiments of the invention obviate the requirement of an external negative supply voltage or attenuation resistors to allow sampling between a positive and negative voltage range. These embodiments result in a relatively lower power sampling solution as well as simplifying any driver circuitry required by the sampler. The embodiments of the invention may be applied to sampling processes within analog-to-digital converters and may also be applicable to various other types of circuits in which a sampling input has input voltages that are lower than their negative supply voltage.

One skilled in the art will recognize that the present invention may be applied to numerous sampling voltage ranges and rates.

In certain embodiments, a sampling switch receives the input voltages from an external input. The sampling switch operates in two states: a non-active state wherein the circuit is not sampling and an active state wherein the circuit is sampling. In the non-active state, when the sampling switch is open, bootstrap capacitors are pre-charged to the single supply voltage. When in the active sampling state, the bootstrap capacitors are used to turn on the input switches.

For example, if the supply voltage is +5V, the bootstrap capacitors will charge to +5V in the non-active, or non-sampling state. When the circuit switches to the active sampling state, the +5V on the bootstrap capacitor is applied from source to gate on the sampling switch, thus causing the input sampling switch to go to a low impedance condition.

The bootstrap pump is arranged in such a way as to incorporate a positive feedback mechanism which latches the switch into an "on" state. The transition from an "off" high-impedance state to an "on" low-impedance state is initiated by a triggering signal input. The positive feedback mechanism continues until the supply voltage is applied across the input switch through the bootstrapped capacitors. This invention allows the sampling circuitry to drive an analog-to-digital converter and other sampling circuits to sample an input sampling voltage range of $\pm V_{DD}$ with a single supply of $V_{DD}$ and ground.

The present invention alleviates the common practice of implementing both a positive and negative input voltage supply. Thus, driver circuitry is simplified resulting in smaller, more reliable, cost-effective, and power saving design solutions.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

FIG. 4A illustrates the transistor-level realization of the bootstrapped switch according to various embodiments of the present invention.

FIG. 4B illustrates the timing relationships of input signals to control the bootstrapped switch according to various embodiments of the present invention.

DETAILED DESCRIPTION OF THE INVENTION

In embodiments of the present invention, a system, device, and method are described for sampling input signal voltages, which may include voltages below a negative supply voltage without requiring static current from the input. Various embodiments of the invention obviate the requirement of an external negative supply voltage or attenuation resistors to allow sampling between a positive and negative voltage range on the input signal. These embodiments result in a relatively lower-power sampling solution as well as simplifying any driver circuitry required by the sampling circuit. The embodiments of the invention may be applied to sampling processes within analog-to-digital converters and may also be applicable to various other types of circuits in which a sampled input has input voltages that are lower than its negative supply voltage.

The following description is set forth for purpose of explanation in order to provide an understanding of the invention. However, one skilled in the art will recognize that embodiments of the present invention, some of which are described below, may be incorporated into a number of different sampling systems and devices. Structures and devices shown below in block diagram are illustrative of exemplary embodiments of the invention and are meant to avoid obscuring the invention. Furthermore, connections between components within the figures are not intended to be limited to direct connections. Rather, data between these components may be modified, re-formatted or otherwise changed by intermediary components.

Reference in the specification to "one embodiment", "in one embodiment" or "an embodiment" etc. means that a particular feature, structure, characteristic, or function described in connection with the embodiment is included in at least one embodiment of the invention. The appearances of the phrase "in one embodiment" in various places in the specification are not necessarily all referring to the same embodiment.

For purposes of clarity, various embodiments of the invention are described in which a sampling circuit operates between a 5V and −5V range. However, one skilled in the art will recognize that the present invention may be applied to numerous sampling voltage ranges. In certain embodiments, the sampling circuitry drives an analog-to-digital converter or other sampling circuits to sample an input voltage range of $\pm V_{DD}$ with a single supply of $V_{DD}$ and ground. This relationship is maintained by controlling a plurality of switches within a bootstrap charge pump. The bootstrap charge pump incorporates a positive feedback mechanism that when in the "on" state maintains an appropriate gate to source voltage on the input switch while the input voltage transitions through the range of voltages of $\pm V_{DD}$.

Figure 1:
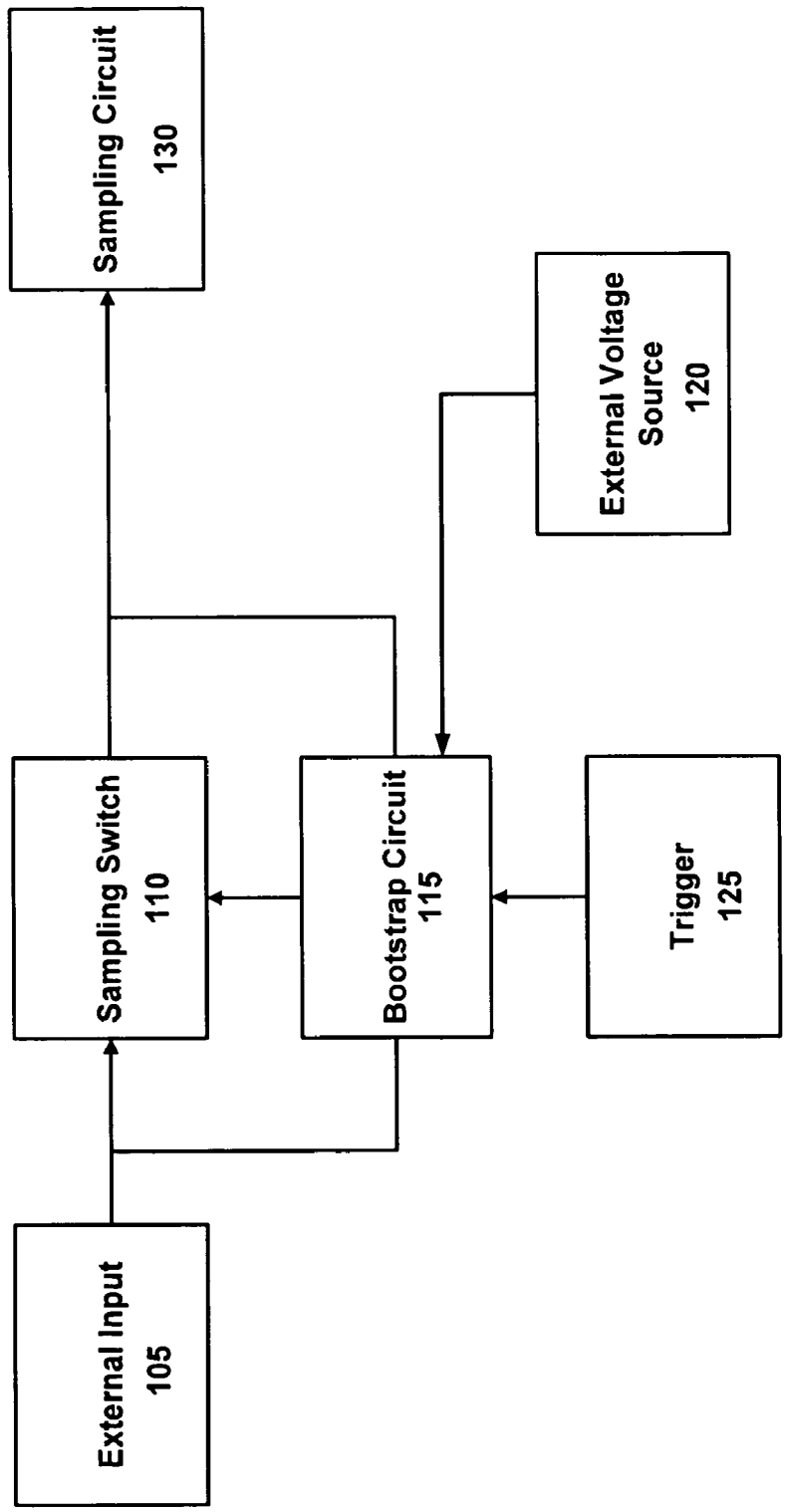
FIG. 1 illustrates a general block diagram of a sampling device according to various embodiments of the invention.

FIG. 1 illustrates a block diagram of sampling circuit according to various embodiments of the invention. An external input 105 allows a user to define a range of input voltages across a sampling circuit. The external input 105, in this example, will range from $\pm V_{DD}$ wherein the sampling will occur within this designated input voltage range.

A sampling switch 110, coupled to the external input 105, receives the input voltages from the external input 105. The sampling switch 110 is in a non-conducting state when the circuit is not sampling. In this "off" state, a bootstrap circuit 115 will charge to the external supply voltage source 120. When in a sampling state or "on" state, the bootstrap circuit 115 will apply $V_{DD}$ to the gate to source of the sampling switch 110, thus putting the input switch into a conducting state.

The bootstrap circuit 115 incorporates a positive feedback latching mechanism to drive the gate source voltage of the sampling switch 110 to an "on" state. A trigger 125, coupled to the bootstrap circuit 115, initiates the positive feedback mechanism.

Figure 2:
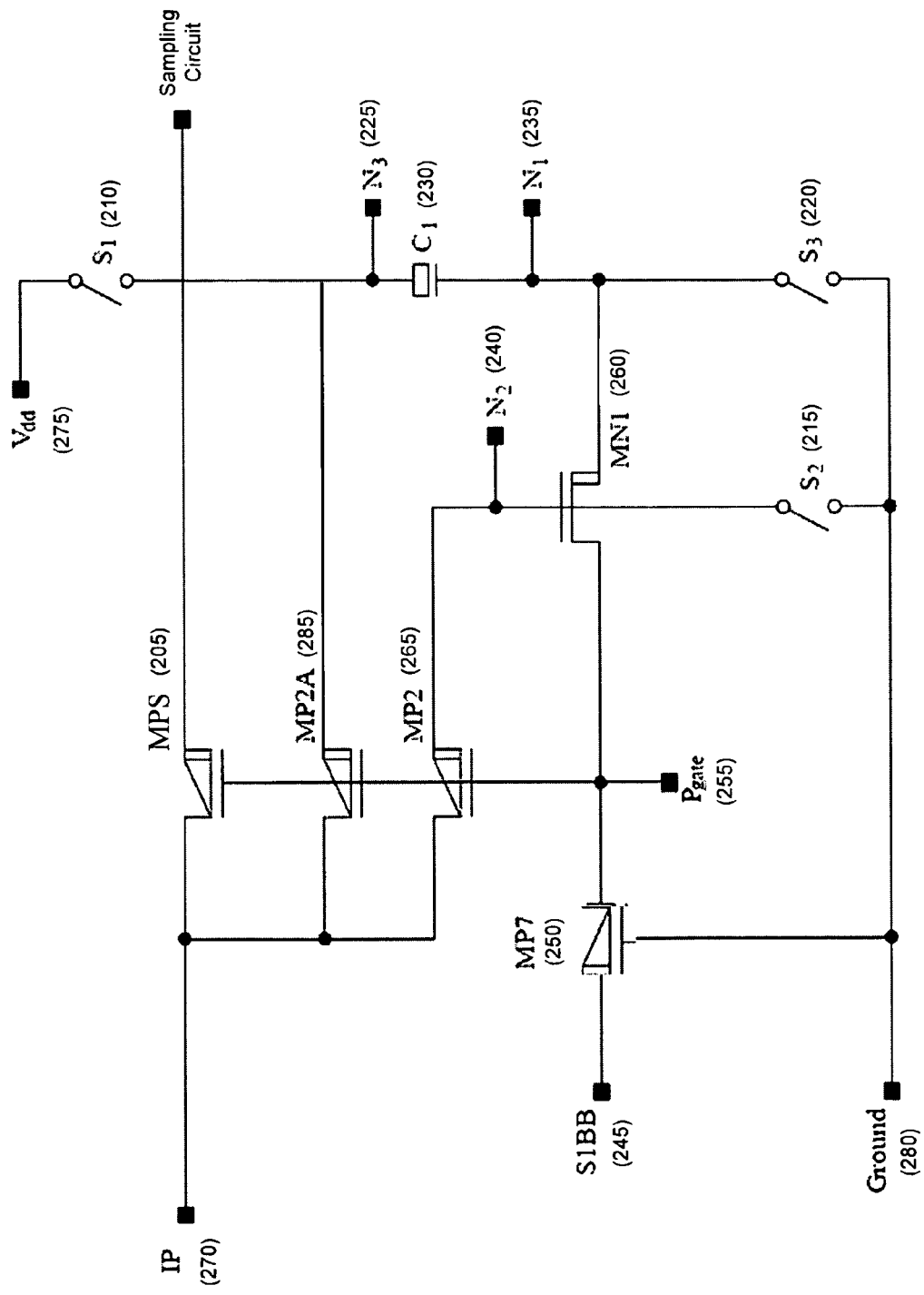
FIG. 2 illustrates a schematic illustrating a bootstrap operation according to various embodiments of the present invention.

FIG. 2 illustrates a simplified schematic of the bootstrap operation according to various embodiments of the invention. The bootstrap generates a gate drive at node Pgate 255 of $V_{IP}$–$V_{DD}$ for the input switch gate MPS 205. The node Pgate 255 is incorporated in a positive feedback loop, which, when in the "on" state, applies a precharged voltage of capacitor, $C_1$ 230, across the gate of the input switch MPS 205.

When the circuit in FIG. 2 is in a non-sampling state, switches $S_1$ 210, $S_2$ 215, and $S_3$ 220 are closed and the capacitor $C_1$ 230 is pre-charged to $V_{DD}$. When the circuit is in a sampling state, the switches $S_1$ 210, $S_2$ 215, and $S_3$ 220 are open.

When the switches $S_1$ 210, $S_2$ 215, and $S_3$ 220 are closed, node $N_3$ is connected to $V_{DD}$ through switch $S_1$ 210 whereas node $N_1$ 235 and node $N_2$ 240 are connected to ground 280 through switches $S_2$ 215 and $S_3$ 220. This state allows for capacitor $C_1$ 230 to be pre-charged to $V_{DD}$, which will later be used in the feedback mechanism of the bootstrap. Also, a fourth node, $S_{1BB}$ 245, is held high allowing the transistor, MP7 250, to conduct so the node Pgate 255 is at $V_{DD}$ keeping the input switch, MPS 205, off. Transistor MN1 260 is held in a non-conducting state through the closed states of switch $S_2$ 215 and $S_3$ 220.

To transition the input switch, MPS 205, to an "on" state, the switches $S_1$ 210, $S_2$ 215, and $S_3$ 220 are opened thereby leaving nodes $N_1$ 235, $N_2$ 240, and $N_3$ 225 floating. $S_{1BB}$ 245 acts as a trigger input in starting the positive feedback process by pulling node Pgate 255 towards ground through MP7 250. MP7 250 will stop conducting when node Pgate 255 is pulled down to a PMOS gate source threshold above ground. This action causes MPS 205, MP2A 285 and MP2 265 to start conducting driving nodes $N_2$ 265 and $N_3$ 225 towards the input voltage IP 270. This action causes node $N_1$ 235 to be driven to a voltage of $V_{DD}$ below node $N_3$ 225 as capacitor $C_1$ 230 has been previously precharged to $V_{DD}$. Node $N_1$ 235 being driven to $V_{DD}$ below node $N_3$ 225, which is driven to the input voltage through MP2A 285 forces device MN1 260 to a conducting state as its gate node $N_2$ 240 is also driven to the input voltage through MP2 265. The closure of MN1 completes a positive feedback latch that forces node Pgate 255 to a voltage of $V_{DD}$ below the input IP 270.

The positive feedback latching process described in paragraph 29 results in a self-switching bootstrap mechanism that allows the sampling of input voltages limited by $V_{DD}$ in the positive direction and by the semiconductor process junction breakdown voltages in the negative direction. The circuit is protected from overvoltage conditions because the gate source voltage applied to MPS is limited to $V_{DD}$. This architecture thus allows the sampling of voltages significantly above the gate oxide breakdown voltage of the semiconductor process.

Figure 3:
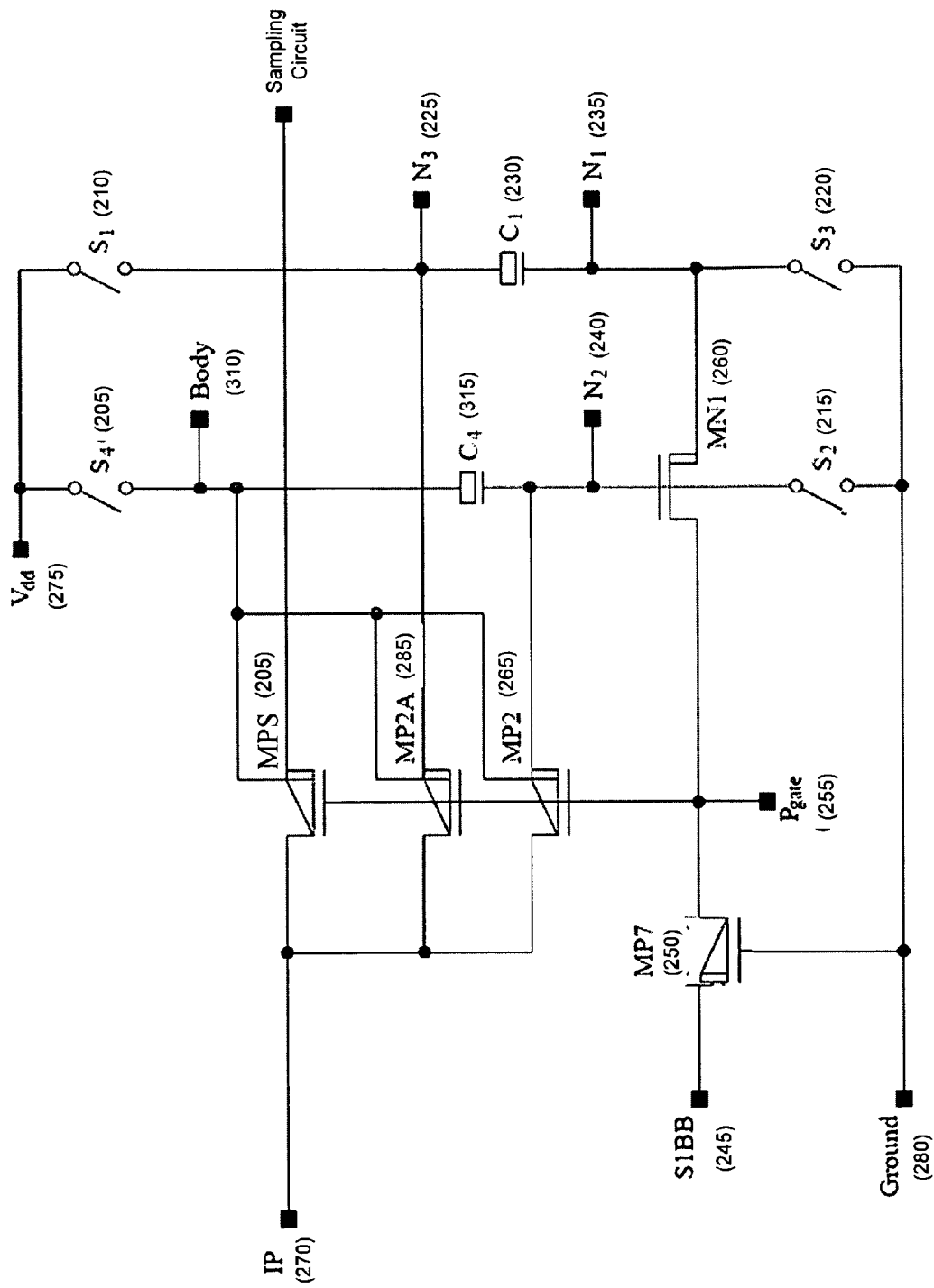
FIG. 3 illustrates a switch with gate and body bootstrapped according to various embodiments of the present invention.

In another embodiment of the present invention, FIG. 3 illustrates input switches MPS 205, MP2A 285 and MP2 265 with both their gate and substrate or body connections bootstrapped. The body or substrate of input switches MPS 205, MP2A 285 and MP2 265 is an Nwell in a P-type substrate connected to ground. Consequently, the node Body 310 cannot be brought below ground without forward biasing this Nwell to P-substrate diode. Bootstrapping allows for a constant input IP 270 to Body 310 voltage without forward biasing the Nwell to P-substrate diode. FIG. 3 illustrates one method of implementing this technique with the addition of a capacitor, $C_4$ 315, and switch, $S_4$ 305.

When the circuit is in a non-sampling state, all the switches, $S_1$ 210, $S_2$ 215, $S_3$ 220, and $S_4$ 305 are closed, thereby precharging the capacitors $C_1$ 230 and $C_4$ 315 to $V_{DD}$. When the circuit in FIG. 3 transitions to the sampling state, the process described in paragraph 29 occurs. In addition, the node Body 310 is now driven to a voltage of node $N_2$ 240 plus $V_{DD}$. As node $N_2$ 240 is driven to the input IP 270, node Body 310 is driven to the input IP 270 plus $V_{DD}$.

In yet another alternate embodiment of the present invention, FIG. 4A illustrates a full transistor level implementation of FIG. 3 in which the switch $S_1$ 210 is replaced with transistor MPS1 405, switch $S_2$ 215 is replaced with transistors MNS2A 410 and MNS2B 415, switch $S_3$ 220 is replaced with transistor MPS3 420, and switch $S_4$ 305 is replaced with transistor MPS4 425. FIG. 4B illustrates the timing relationships between the input control signals.

The foregoing description of the invention has been described for purposes of clarity and understanding. It is not intended to limit the invention to the precise form disclosed. Various modifications may be possible within the scope and equivalence of the appended claims.

We claim:

1. A sampling system using a single voltage source to sample an analog signal over an input voltage range having positive and negative values, the system comprising:
   an input on which the analog signal is received;
   a sampling switch, coupled to the input, the sampling switch defining an active state or an inactive state;
   a bootstrap circuit, coupled to the sampling switch, the bootstrap circuit controlling a gate and substrate voltage on the sampling switch to control a first state of the sampling switch and the bootstrap circuit having a positive feedback mechanism allowing for self-switching bootstrap mechanism;
   a voltage source, coupled to the bootstrap circuit, the voltage source providing a positive voltage to which the bootstrap circuit is charged; and
   a sampling circuit, coupled to the sampling switch, the sampling circuit sampling the analog signal during the active sampling state.

2. The system of claim 1 wherein the bootstrap circuit controls a gate and substrate voltage of the sampling switch such that a gate-to-source voltage and a gate-to-substrate voltage are held constant over the input voltage range.

3. The system of claim 1 further comprising a charge pump capacitor, coupled within the bootstrap circuit, the charge pump capacitor is charged by the voltage source to a first voltage level during the inactive state.

4. The system of claim 3 wherein the first voltage level is equal to a voltage level of the voltage source.

5. The system of claim 1 further comprising a charge pump capacitor, coupled within the bootstrap circuit, the charge pump capacitor applies a first voltage level across a gate-to-source of the sampling switch during the active state.

6. The system of claim 5 wherein the bootstrap circuit drives a gate of the sampling switch to a first voltage below an input voltage of the analog signal when the sampling switch is in an active state.

7. The system of claim 5 wherein the bootstrap circuit drives a substrate of the sampling switch to a first voltage level across the source-to-substrate of the sampling switch during the active state.

8. The system of claim 1 wherein the bootstrapped circuit incorporates a positive feedback latching mechanism that self generates the switching voltages necessary to apply the bootstrap capacitors to the gate-to-source nodes.

9. The system of claim 1 wherein the bootstrapped circuit incorporates a positive feedback latching mechanism that self generates the switching voltages necessary to apply the bootstrap capacitors to the substrate-to-source nodes.

10. The system of claim 9 wherein the positive feedback latching mechanism of the bootstrap circuit incorporates an input trigger that initiates the positive feedback mechanism.

11. A method for sampling an input signal comprising the steps of:
    placing a sampling switch in an inactive state;
    charging a bootstrap circuit to a first voltage level related to an external voltage source;
    placing the sampling switch in an active state by:
       placing a first pre-charged capacitor voltage between the source-to-gate nodes of the sampling switch;
       placing a second pre-charged capacitor voltage between the substrate-to-source nodes of the sampling switch; and
       causing a self-switching bootstrap operation to occur using a positive feedback latching circuit such that a positive voltage range is sampled and a negative voltage range is sampled.

12. The method of claim 11 wherein the positive feedback mechanism comprises a bootstrap charge pump that minors voltages on the input signal to achieve a constant gate-to-source voltage over a positive and negative range of input voltages.

13. The method of claim 11 wherein the positive feedback mechanism comprises a bootstrap charge pump that minors voltages on the input signal to achieve a constant source-to-substrate voltage over a positive and negative range of input voltages.

14. The method of claim 11 wherein the bootstrap circuit protects the input switch from a voltage overload.

15. The method of claim 11 wherein the positive range and the negative range are symmetrical around ground.

16. The method of claim 11 further comprising the step of providing a triggering signal input that initiates the self-switching bootstrap operation.

* * * * *